April 28, 1964 TOSHIO SHINADA ETAL 3,131,320

AUDIO-FREQUENCY CRYSTAL VIBRATOR

Filed Sept. 1, 1960

INVENTORS

TOSHIO SHINADA AND SUSUMU OINUMA

BY Linton and Linton

ATTORNEYS

United States Patent Office 3,131,320
Patented Apr. 28, 1964

3,131,320
AUDIO-FREQUENCY CRYSTAL VIBRATOR

Toshio Shimada and Susumu Oinuma, Tokyo, Japan, assignors to K. K. Kinsekisha Kenkyujo, Tokyo, Japan, a corporation of Japan Filed Sept. 1, 1960, Ser. No. 53,450
Claims priority, application Japan Dec. 23, 1959
1 Claim. (Cl. 310—9.6)

The present invention relates to crystal vibrators for audio-frequency use. An object of the present invention is to provide tuning fork-type rock crystal resonators which can be used as piezoelectric oscillators for the audio-frequency range.

An object of this invention is to provide audio-frequency electric resonators having high efficiency and which work accurately.

Another object of this invention is to provide an easy means for manufacturing the above mentioned audio-frequency electric resonators.

Still another object of this invention is to provide crystal vibrators for audio-frequency use which are easily mounted on any base body. Heretofore a tuning fork-type rock quartz crystal resonator has been provided mainly for wave filter use and not for piezoelectric oscillator for audio-frequency use. This is because this resonator is considered to have a low Q value and high resonant impedance, accordingly not to work well under a weak current supply.

In a crystal vibrator according to the present invention, the main vibration plane contains the electrical axis (axis X) of crystal and the nodal points can be selected in the intersectional portions of the prongs and the butt and said nodal points are utilized for mounting means as well as for electrode terminals.

In consequence the Q value of the present crystal vibrator is large for example up to 35,000, and which value has never been attained for a known tuning fork-type audio-frequency crystal vibrator. Some examples of resonant impedance value of crystal vibrators according to the present invention are as follows: 28 kiloohms at 1900 cycles, 130 kiloohms at 900 cycles, and 270 kiloohms at 500 cycles. And a crystal vibrator according to the present invention can work down to 250 cycles as a resonator unit of an audio-frequency oscillator and which frequency value is almost the lowest practically obtainable by means of a quartz crystal vibrating unit.

Although a crystal vibrator according to the present invention can be used for an oscillator use, it may naturally as well be used for a wave filter use because the electric current intensity supplied to a wave filter circuit is much larger than that in an oscillator circuit.

The device of the present invention comprises; a vibrator body of U shape cut from a quartz plate, said quartz plate having front and rear-leg portions, said front portion including the electrical axis (axis X) of the quartz crystal, said rear leg portion being parallel to the front portion, said vibrator body also having a pair of parallel legs and a transverse butt or base member, said legs being rectangular prisms having one equal dimension, said transverse butt or base member being a rectangular prism and being parallel to the electrical axis (axis X) of the quartz crystal and meeting with the lower end of the legs at right angles, the lengths of said prongs and said butt portion being selected so as the intersectional portions of said prongs and butt to be nodal points of vibration of said vibrator body; two pairs of surface film electrodes being applied on all four sides of each leg closely adhering and separately, each pair of said electrodes facing each other by sandwiching the leg and being soldered with one of the following mounting pins which are served for terminals of said electrodes; two pairs of mounting pins, first pair thereof being mounted on the front portion and another pair thereof being mounted on the rear portion, each one of said pins being situated at approximately the central portion in a determined area, said area being formed by intersection of the common front portions or by intersection of the common rear portion of above mentioned legs and the transverse butt member. The two legs with the integral portions of the transverse butt or base constitute an L-shape structure.

An embodiment of the present invention, illustrated in the accompanying drawings, will hereinafter be described.

Figure 1:
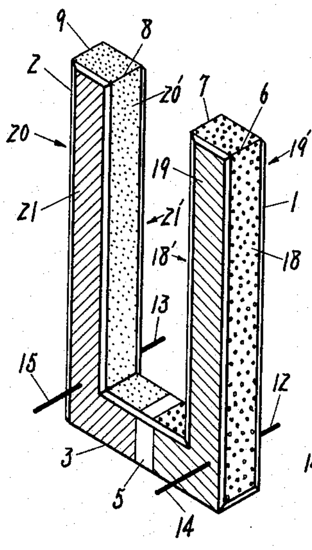
FIG. 1 is an oblique view of a device according to the present invention showing the front portion.
Figure 2:
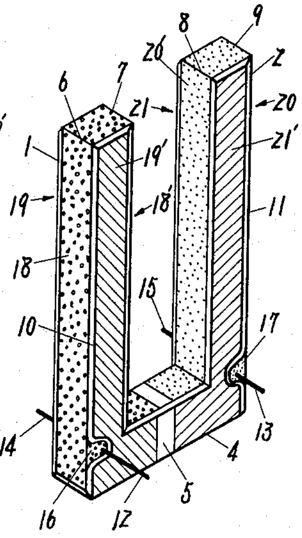
FIG. 2 is an oblique view of the device given in FIG. 1 showing the rear portion.
Figure 3:
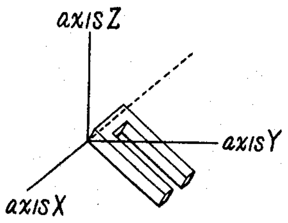
FIG. 3 is a schematic diagram of the cutting of a quartz crystal for preparing a device according to this invention.

The device shown in FIG. 1 and FIG. 2 is constituted as follows. The device is of U shape with legs 1 and 2 and transverse base 3, the legs with the integral separate portion of the base being of L shape. The front and rear portions of the vibrator body are provided respectively with a pair of mounting pins 14, 15 and 12, 13. The front leg 1 contains the X or electrical axis of the crystal. The whole surface of the vibrator body is first coated with a surface film of a metal. The coating of the film may be applied by plating or by vacuum evaporation. Each edge of said vibrator body except the following portions is then shaved off, said portions being the bottom lateral edges 3, 4 of the transverse butt member 5, the top transversal edges 6, 7, 8 and 9 of the legs 1 and 2, and the small portions near the mounting pins 12 and 13 on the rear outer longitudinal edges 10, 11.

The metal coating at the shaved off part of the edges is excised by above mentioned shaving. The metal coating on the central circumferential surface 5 of the transverse butt or base member 3 is also excised as shown in FIGS. 1 and 2. The metal coating around the feet of the mounting pins 12 and 13 is excised also in the remaining small coated portions 16 and 17, and said portions are connected respectively to the outer coated sides of the respective legs.

By the above mentioned construction of the device, two pairs of electrodes 18, 18′ (not seen) and 19, 19′ are applied on the leg 1, and another two pairs of electrodes 20 (not seen), 20′ and 21, 21′ are applied on the leg 2. The electrodes 18 and 18′, or 20 and 20′ are respectively connected with each other at the top of the leg 1 or 2 respectively, and the electrodes 19 and 19′, or 21 and 21′ are connected with each other at the bottom (not seen) of the transverse butt or base member 5, and these four sets of electrodes 18—18′, 19—19′, 20—20′, 21—21′ are respectively soldered to the mounting pins 12, 14, 13 and 15 respectively.

Figure 4:
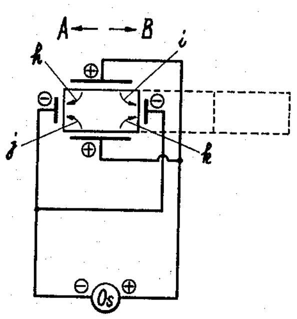
FIG. 4 is a schematic diagram showing the action of a device according to this invention.

When a device according to this present invention is connected to an audio-frequency oscilaltor *Os*, looking over one leg, shown in FIG. 4, the polarities of the electrodes at a given instant will be designated by sign ⊕ and ⊖. The electric lines of force, shown by arrows *h, i, j,* and *k,* are impressed on, by an applied voltage and the senses of said lines of force reverse at the next instant, by the reversion of polarities of said impressed voltage at the same next instant. In consequence, the leg vibrates in the direction AB (FIG. 4).

By assuming the polarities of two legs opposite, that is when the polarities of the equivalent pairs of electrodes on said two legs are opposite, the device vibrates as a resonator accurately like a tuning fork, and stabilizes the frequency of the oscillator, with high efficiency.

Figure 6:
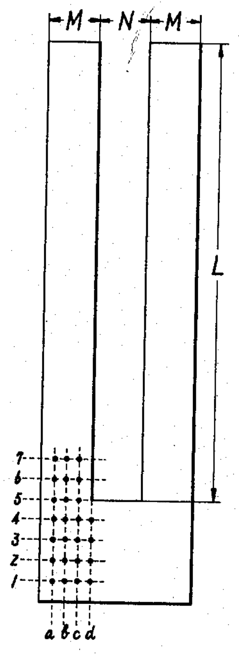
FIG. 6 is a front view of a vibrator body according to the present invention showing the positions of the mounting pin corresponding to the data of FIG. 5.
Figure 5:
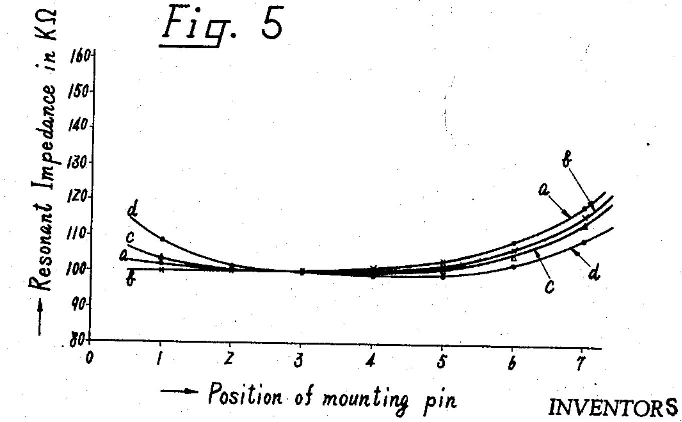
FIG. 5 is a graphic chart showing the relation between positions of the mounting pin and the resonance impedance.

As to the location where the mounting pins are to be applied points *a*–2, 3, 4, *b*–2, 3, 4, and *c*–2, 3, 4 shown in FIG. 6 are optimum, that is the resonant impedance of a device of this invention is minimum when mounting pins are applied at an approximately central portion in the next following area, said area being formed by the intersection of the common front portions or by the intersection of the common rear portions of the legs and the transverse butt or base member. The approximate setting of mounting pins in the above mentioned way is very advantageous for manufacturing a crystal vibrator. The experimental data shown in FIG. 5 are obtained with a vibrator shown in FIG. 6, where L is 35.9 mm., M and N are respectively 2 mm., the thickness is 1.5 mm., the spacing between adjacent lines of points 1 to 7 or A to D is 0.5 mm., and the resonant frequency is 1,300 cycles. However, the feature of the characteristics given in FIG. 5 is almost equal to that of a device of any dimension.

In addition to the above mentioned advantages, a device according to this present invention has the following advantages, that is: its electrodes are capable of being formed by simple metal coating on an entire surface and partial excising processes, the cutting work of making the quartz crystal for making a vibrator body is easy because it has no oblique or curved surfaces, and the mounting of said device on any base is simple and stable because it has four mounting pins which are symmetrically situated and which are also used for electrode terminals.

Having thus described our invention, what we claim is:

A crystal vibrator for audio-frequency use comprising a vibrator body of U-shape cut from a quartz crystal plate, said plate having front and rear portions, said front portion including the electrical axis of the quartz crystal, said rear portion being parallel to the front portion, said vibrator body having a pair of parallel prongs and a transverse butt portion, said prongs being rectangular prisms of equal dimensions, said transverse butt portion being a rectangular prism and being parallel to the electrical axis of the quartz crystal and meeting with the lower end of said prongs at right angles, the lengths of said prongs and said butt portion being selected so as the intersectional portions of said prongs and butt portion will be nodal points of vibration of said vibrator body; two pairs of surface film electrodes being formed on four sides of each prong closely adhering and separated from each other, each pair of said electrodes on a given said prong facing each other by being applied against sides of said prong and being soldered with one of the following mounting pins which serve as terminals for said electrodes; two pairs of mounting pins, a pair thereof being mounted on the front portion and another pair of said pins being mounted on the rear portion, each one of said pins being situated at approximately the central portion in a given area of two defined areas on the respective two opposite sides of said plate, each said defined area being formed respectively by the intersection of the common front portions or by the intersection of the common rear portions of the above mentioned prongs and the transverse butt portion.

References Cited in the file of this patent

UNITED STATES PATENTS

| | | |
|---|---|---|
| 2,081,405 | Mason | May 25, 1937 |
| 2,666,196 | Kinsley et al. | Jan. 12, 1954 |

OTHER REFERENCES

"Marconi Review," vol. XVI, No. 111, October 1953.

"Wireless Engineer," vol. 30, No. 7, July 1953, pages 161–163.